(12) United States Patent
Fujimura

(10) Patent No.: US 8,144,502 B2
(45) Date of Patent: Mar. 27, 2012

(54) STATIC RANDOM ACCESS MEMORY

(75) Inventor: Yuki Fujimura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 12/782,611

(22) Filed: May 18, 2010

(65) Prior Publication Data

US 2010/0290269 A1    Nov. 18, 2010

(30) Foreign Application Priority Data

May 18, 2009 (JP) .................................. 2009-119695

(51) Int. Cl.
*G11C 11/00* (2006.01)
(52) U.S. Cl. ........................................ 365/154; 365/156
(58) Field of Classification Search .................. 365/154, 365/156, 230.05
See application file for complete search history.

(56) References Cited

U.S. PATENT DOCUMENTS

| 6,621,727 B2 * | 9/2003 | Chen | 365/154 |
| 7,961,501 B1 * | 6/2011 | Ryan | 365/154 |
| 2004/0156230 A1 * | 8/2004 | Satomi et al. | 365/154 |

OTHER PUBLICATIONS

M. Yamaoka et al., "Low-Power Embedded SRAM Modules with Expanded Margins for Writing," Digest of Technical Papers, ISSCC 2005, pp. 480-481.
S. Ohbayashi et al., "A 65 nm SoC Embedded 6T-SRAM Design for Manufacturing with Read and Write Cell Stabilizing Circuits," Digest of Technical Papers, 2006 Symposium on VLSI Circuits, pp. 17-18.
Background Art Information.

* cited by examiner

*Primary Examiner* — Anh Phung
(74) *Attorney, Agent, or Firm* — Knobbe, Martens, Olson & Bear, LLP

(57) ABSTRACT

Included are a memory cell, a first metal interconnection, a variable capacitance circuit and a connection switch. The memory cell includes cross-coupled first and second inverters which are connected to a power supply node. The first metal interconnection is connected to the power supply node. The variable capacitance circuit includes: second and third metal interconnections electrically connected to a connection node; and a controller capable of controlling electrical connection between the third metal interconnection and the connection node. The connection switch is connected between the first metal interconnection and the connection node of the variable capacitance circuit. The connection switch is configured to electrically connect the first metal interconnection and the connection node in a write operation of the memory cell.

11 Claims, 4 Drawing Sheets

STATIC RANDOM ACCESS MEMORY

CROSS-REFERENCE TO RELATED APPLICATIONS

This Application is based upon and claims the benefit of priority from the prior Japanese Patent Application No. P2009-119695, filed on May 18, 2009; the entire contents of which are incorporated herein by reference.

BACKGROUND

1. Field

Embodiments described herein relate generally to static random access memory.

2. Description of Related Art

A static random access memory (SRAM) includes multiple memory cells, which consist of MOS (metal oxide semiconductor) transistors. Each transistor has a various characteristic due to the random dopant fluctuation (RDF). For this reason, there are some unreadable or unwritable cells in a large capacity SRAM. Therefore it is important to secure the read and write operations against the characteristic variation. Nevertheless, if transistors are shrinked to reduce the area of the chip, variation among the transistors becomes larger, and accordingly variation in characteristics among the memory cells becomes larger. On the other hand, if the power supply voltage of the SRAM is decreased to reduce the power consumption, some transistors, which have a higher threshold voltage, can operate under linear region. This can makes a mismatch among the current drivability of the memory-cell transistors and causes failure in read and write operations.

It has been known that the controlling of terminal voltages of the inverters constituting each SRAM memory cell is effective for coping with these kinds of problems. As one of technologies for controlling a terminal voltage of an inverter, there is disclosed a technology in which: a source terminal of a PMOS (p-type metal oxide semiconductor) transistor of the inverter is connected with a capacitor element constituted of a metal interconnection; and thereby the PMOS transistor and the capacitor element share charges to adjust the source voltage of the PMOS transistor (Digest of Technical Paper, 2006 Symposium on VLSI circuits, pp. 17-18). An advantage of this technology is that capacitor elements can be easily configured by use of metal interconnections running above the memory cell array. Therefore it doesn't require any additional chip area.

DETAILED DESCRIPTION

Figure 1:
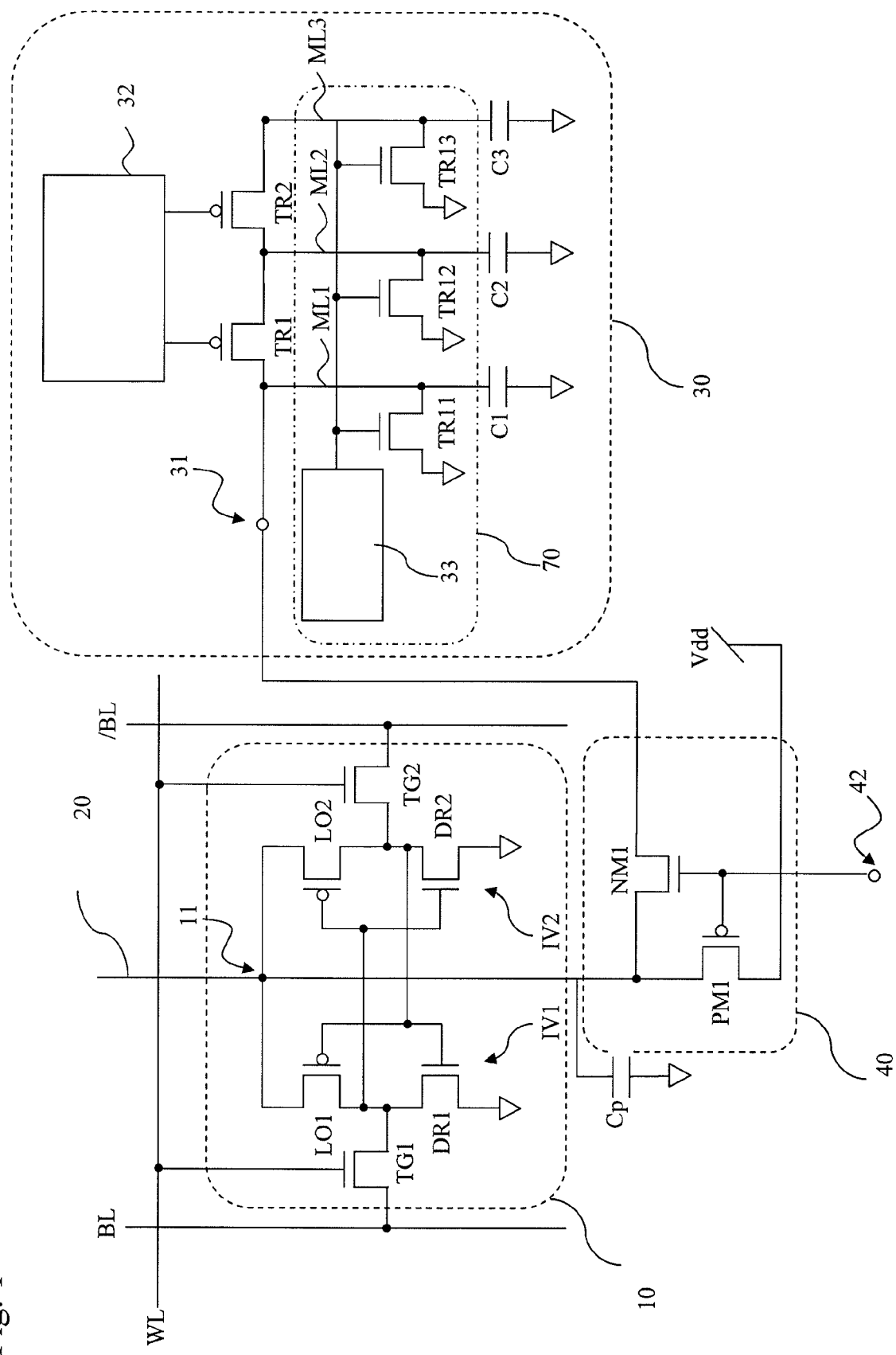
FIG. 1 is a circuit diagram showing configurations, respectively, of a memory cell, a variable capacitance circuit and a connection switch in an SRAM according to Embodiment 1 of the present invention.

Referring to the drawings, descriptions will be hereinbelow provided for embodiments of the present invention.

[Embodiment 1]

FIG. 1 is a circuit diagram showing configurations, respectively, of a memory cell, a variable capacitance circuit and a connection switch in an SRAM according to Embodiment 1 of the present invention.

As shown in FIG. 1, the SRAM according to this embodiment includes a memory cell 10, a metal interconnection 20, a variable capacitance circuit 30 and a connection switch 40.

The memory cell 10 includes CMOS (complementary metal oxide semiconductor) inverters IV1, IV2, and transfer gate transistors TG1, TG2.

The CMOS inverter IV1 is connected between a power supply node 11 and a ground node. The CMOS inverter IV1 includes a load transistor LO1 as a pMOS transistor and a driver transistor DR1 as an nMOS transistor. The CMOS inverter IV2 is connected between the power supply node 11 and the ground node. The CMOS inverter IV2 includes a load transistor LO2 as a pMOS transistor and a driver transistor DR1 as an nMOS transistor. An output terminal of the CMOS inverter IV1 is connected to an input terminal of the CMOS inverter IV2, whereas an input terminal of the CMOS inverter IV1 is connected to an output terminal of the CMOS inverter IV2. The transfer gate transistor TG1 is a MOS (metal oxide silicon) transistor. The transfer gate transistor TG1 is a MOS transistor, and includes a gate terminal that is connected to a word line WL. One terminal (source terminal or drain terminal) of a current path of the transfer gate transistor TG1 is connected to a bit line BL, while the other terminal (source terminal or drain terminal) thereof is connected to the output terminal of the CMOS inverter IV1 as well as to the input terminal of the CMOS inverter IV2. In this respect, the current path is a path in which an electric current flows, and which includes a source region, a channel region and a drain region of a MOS transistor. Hereinafter, the same applies to the other current paths. The transfer gate transistor TG2 is a MOS transistor, and includes a gate terminal that is connected to the word line WL. One terminal (source terminal or drain terminal) of a current path of the transfer gate transistor TG2 is connected to a bit line /BL, while the other terminal (source terminal or drain terminal) thereof is connected to the output terminal of the CMOS inverter IV2 as well as to the input terminal of the CMOS inverter IV1.

The memory cell 10 is a SRAM memory including the cross-coupled CMOS inverters IV1, IV2 which are connected to the same power supply node 11.

The metal interconnection 20 is connected to the power supply node 11 of the memory cell 10. The metal interconnection 20 has a intrinsic capacitance Cp.

The variable capacitance circuit 30 includes a metal interconnection ML1, a MOS transistor TR1, a metal interconnection ML2, a MOS transistor TR2, a metal interconnection ML3, a capacitance controller 32 and a discharger 70. The metal interconnection ML1 is connected to a connection node 31, and has an intrinsic capacitance C1. One terminal (source terminal or drain terminal) of a current path of the MOS transistor TR1 is connected to the connection node 31. The metal interconnection ML2 is connected to the other terminal (source terminal or drain terminal) of the current path of the MOS transistor TR1, and has an intrinsic capacitance C2. One terminal (source terminal or drain terminal) of a current path of the MOS transistor TR2 is connected to the other terminal (source terminal or drain terminal) of the current path of the MOS transistor TR1, to which the metal interconnection ML2 is connected. The metal interconnection ML3 is connected to the other terminal (source terminal or drain terminal) of the current path of the MOS transistor TR2, and has an intrinsic capacitance C3. The capacitance controller 32 is connected to the gate terminal of the MOS transistor TR1 and the gate terminal of the MOS transistor TR2. The capacitance controller 32 thus determines a conduction condition of the current path of the MOS transistor TR1 and a conduction condition of the current path of the MOS transistor TR2. The discharger 70 discharges charges accumulated in each of the capacitance C1 included in the metal interconnection ML1, the capacitance C2 included in the metal interconnection ML2, and the capacitance C3 included in the metal interconnection ML3.

The variable capacitance circuit 30 is capable of adjusting an electric capacitance C of the variable capacitance circuit 30 through the determination of the conduction conditions of the respective MOS transistors TR1, TR2 by the capacitor controller 32. For example, in a case where the MOS transistor TR1 is conductive and the MOS transistor TR2 is non-conductive, the electric capacitance C of the variable capacitance circuit 30 is found using an equation $1/C=1/C1+1/C2$. In a case where the MOS transistor TR1, TR2 are both conductive, the electric capacitance C of the variable capacitance circuit 30 is found using an equation $1/C=1/C1+1/C2+1/C3$. Voltages to be applied to the respective gate terminals of the MOS transistors TR1, TR2 are determined in advance of an actual use, for example during the manufacturing process. The voltages are set up in the capacitance controller 32.

The connection switch 40 is connected between the metal interconnection 20 and the connection node 31 of the variable capacitance circuit 30. The connection switch 40 has a function of electrically connecting the metal interconnection 20 and the connection node 31 together for a write operation of the memory cell 10. As shown in FIG. 1, the connection switch 40 includes, for example, a PMOS transistor PM1 and an NMOS transistor NM1 which are complementarily connected. A terminal connected commonly to a gate terminal of the PMOS transistor PM1 and a gate terminal of the NMOS transistor NM1 in the connection switch 40 is a switching signal terminal 42. When a switching signal Low is inputted into the switching signal terminal 42, the PMOS transistor PM1 is conductive whereas the NMOS transistor NM1 is non-conductive. Thus, a power supply voltage Vdd is electrically connected to the metal interconnection 20. When a switching signal High is inputted into the switching signal terminal 42, the PMOS transistor PM1 is non-conductive whereas the NMOS transistor NM1 is conductive. Accordingly, the connection node 31 of the variable capacitance circuit 30 is electrically connected to the metal interconnection 20.

The discharger 70 included in the variable capacitance circuit 30 has the function of discharging charges accumulated in each of the capacitance C1 included in the metal interconnection ML1, the capacitance C2 included in the metal interconnection ML2, and the capacitance C3 included in the metal interconnection ML3. The discharger 70 includes, for example, a MOS transistor TR11, a MOS transistor TR12, a MOS transistor TR13 and a discharge controller 33. One terminal (source terminal or drain terminal) of a current path of the MOS transistor TR11 is connected to the metal interconnection ML1, and the other terminal (source terminal or drain terminal) thereof is connected to the ground potential. One terminal (source terminal and drain terminal) of a current path of the MOS transistor TR12 is connected to the metal interconnection ML2, while the other terminal thereof is connected to the ground potential. One terminal (source terminal or drain terminal) of a current path of the MOS transistor TR13 is connected the metal interconnection ML3, and the other terminal thereof is connected to the ground potential. The discharge controller 33 is connected to gate terminals of the respective MOS transistors TR11, TR12, TR13. Thus, the discharge controller 33 controls conduction conditions of the current paths of the MOS transistors TR11, TR12, TR13, respectively. The discharge controller 33 is capable of discharging charges accumulated in each of the capacitance C1, C2, C3 included in the metal interconnections ML1, ML2, ML3 by making each of the current paths of the MOS transistors TR11, TR12, TR13 conductive, respectively. Note that the configuration of the discharger 70 is not limited to what has been described above. The configuration of the discharger 70 may be whatever enables the discharger 70 to discharge charges accumulated in each of the capacitance C1, C2, C3. For example, the discharger 70 may include pn-junction diodes or the like instead of the MOS transistors TR11, TR12, TR13, respectively.

In addition, the capacitance C1 included in the metal interconnection ML1, the capacitance C2 included in the metal interconnection ML2 and the capacitance C3 included in the metal interconnection ML3 in the variable capacitance circuit 30 may be different from one another. For example, the electric capacitances of the respective capacitances may be set to $C1>C2>C3$. The adjusting of the electric capacitances of the capacitances C1, C2, C3 included in the metal interconnections ML1, ML2, ML3 can be achieved, for example, through adjustment of the interconnection lengths or widths of the respective metal interconnections, respectively.

Effects which will be described later can be obtained from the use of the NMOS transistors for the MOS transistors TR1, TR2.

Next, descriptions will be provided for operations, respectively, of the memory cell 10, the metal interconnection 20, the variable capacitance circuit 30 and the connection switch 40 in the SRAM configured as shown in FIG. 1. In this respect, descriptions will be provided for how the memory cell 10, the metal interconnection 20, the variable capacitance circuit 30 and the connection switch 40 operate in a case where the current paths of the respective MOS transistors TR1, TR2 are set up in a way that the current paths thereof are always conductive.

While the memory cell 10 is performing a read operation, or while the memory cell 10 is not selected (in a non-selected state), the connection switching signal Low is inputted into the switching signal terminal 42 in the connection switch 40. For this reason, the metal interconnection 20 is electrically connected to the power supply voltage Vdd. Thereby, the power supply voltage is applied to the power supply node 11 in the memory cell 10. At this time, in the variable capacitance circuit 30, the discharge controller 33 makes the current paths of the respective MOS transistors TR11, TR12, TR13 conductive, and accordingly discharges charges which have been accumulated in each of the capacitances C1, C2, C3 included in the respective metal interconnections ML1, ML2, M3.

While the memory cell 10 is performing a write operation, the connection switching signal High is inputted into the switching signal terminal 42 of the connection switch 40. For this reason, the metal interconnection 20 is electrically connected to the connection node 31 in the variable capacitance circuit 30. Thereby, charges are shared between the metal interconnection 20 and the variable capacitance circuit 30. At this time, the electric potentials of the metal interconnections ML1, ML2, ML3 are low because the charges accumulated in each of the capacitances C1, C2, C3 of the metal interconnections ML1, ML2, ML3 have been discharged, respectively, whereas the voltage of the capacitance Cp of the metal interconnection 20 is high because the capacitance Cp of the metal interconnection 20 is charged with charges by the power supply voltage. As a result, the sharing of the charges between the metal interconnection 20 and the variable capacitance circuit 30 shifts the voltage of the metal interconnection 20 to a certain lower voltage than Vdd. Thereby, the voltage of the power supply node 11 in the memory cell 10, to which the metal interconnection 20 is connected, shifts to the low voltage.

As described above, the power supply voltage is applied to the metal interconnection 20 to which the power supply node 11 of the memory cell 10 is connected during the read operation of the memory cell 10, whereas the metal interconnection 20 to which the power supply node 11 of the memory cell 10 is connected is electrically connected to the variable capacitance circuit 30 to share the charges during the write operation of the memory cell 10.

In this respect, a voltage, which is applied to the metal interconnection 20 after the charge sharing, is determined by a value of the capacitance Cp of the metal interconnection 20 and a value of the capacitance C of the variable capacitance circuit 30. Thereby, the voltage, which is applied to the metal interconnection 20 after the charge sharing, can be set at a desired voltage, if the capacitance C of the variable capacitance circuit 30 is adjusted by the capacitance controller 32 during the manufacturing process. Heretofore, there has been the following problem: variable capacitance circuits according to the prior art each include one metal interconnection, while the variable capacitance circuits 30 according to this embodiment each include the multiple metal interconnections; and accordingly, the voltage of each metal interconnection cannot be equal to a desired voltage after the charge sharing because of the variation of the capacitance among the metal interconnections. In contrast, this embodiment enables the electric capacitance of the capacitance C to be adjusted to the target by the capacitance controller 32 using the multiple metal interconnections ML1, ML2, ML3. Thereby, this embodiment enables the voltage of the metal interconnection 20 to be closer to the desired voltage after the shares are shared. Thus, this embodiment can surely suppress the variation in the data-write characteristics among the memory cells.

Figure 2:
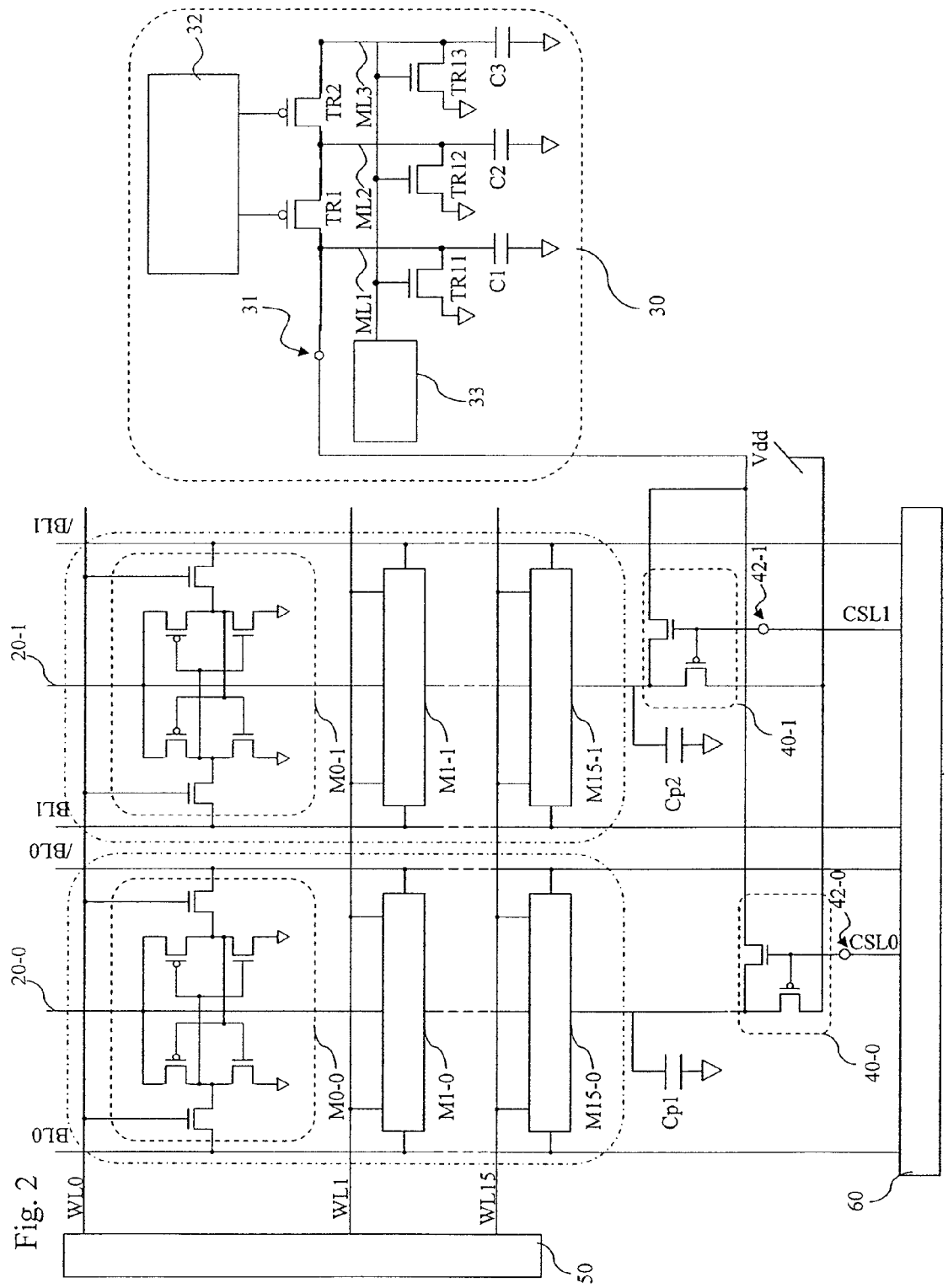
FIG. 2 is a circuit diagram showing a configuration of the SRAM according to Embodiment 1 of the present invention.

Next, referring to FIG. 2, descriptions will be provided for a configuration of an SRAM to which the memory cell 10, the metal interconnection 20, the variable capacitance circuit 30 and the connection switch 40 shown in FIG. 1 are applied. FIG. 2 is a circuit diagram showing the configuration of the SRAM according to Embodiment 1 of the present invention.

Out of multiple sub-arrays constituting a memory cell array according to this embodiment, two sub-arrays S1, S2 will be described as the configuration of the SRAM according to this embodiment. Memory cells M0-0, M1-0, . . . , M15-0 sharing bit lines BL0, /BL0 constitute one sub-array S1. Similarly, memory cells M0-1, M1-1, . . . , M15-1 sharing bit lines BL1, /BL1 constitute another sub-array S2. The memory cells are each connected to a corresponding one of word lines WL0 to WL15. The memory cells M0-0 to M15-0, M0-1 to M15-1 each have the same configuration as does the memory cell 10 shown in FIG. 1.

The word lines WL0 to WL15 are connected to a row decoder 50. The bit lines BL0, /BL0, BL1, /BL1 are connected to a column decoder 60. The row decoder 50 decodes a row address which the row decoder 50 receives from the outside of the row decoder 50, and thus selects one of the word lines WL0 to WL15. The column decoder 60 decodes a column address which the column decoder 60 receives from the outside of the column decoder 60, and thus selects one of the bit lines BL0, /BL0, BL1, /BL1.

The power supply nodes 11 of the memory cells included in the sub-array S1 are commonly connected to a metal interconnection 20-0. Similarly, the power supply nodes 11 of the memory cells included in the sub-array S2 are commonly connected to a metal interconnection 20-1. The metal interconnection 20-0 has a capacitance Cp0. The metal interconnection 20-1 has a capacitance Cp1. The metal interconnections 20-0, 20-1 are connected to connection switches 40-0, 40-1, respectively.

The connection switches 40-0, 40-1 each have the same configuration as the connection switch 40 shown in FIG. 1. The connection switches 40-0, 40-1 are controlled by switching signals CSL0, CSL1 which are inputted into the switching signal terminals 42-0, 42-1 from the column decoder 60, respectively. For example, when the memory cell M0-0 is selected and thus performs a write operation, the metal interconnection 20-0 and the connection node 31 of the variable capacitance circuit 30 are electrically connected together by setting a voltage of the switching signal CSL0, which the column decoder 60 outputs to the connection switch 40-0, at High. At this time, the metal interconnection 20-1 is electrically connected to the power supply voltage Vdd by setting a voltage of the switching signal CSL1, which the column decoder 60 outputs to the connection switch 40-1, at Low. Similarly, when the memory cell M0-1 is selected and thus performs a write operation, the metal interconnection 20-1 and the connection node 31 of the variable capacitance circuit 30 are electrically connected together by setting a voltage of the switching signal CSL1, which the column decoder 60 outputs to the connection switch 40-1, at High. At this time, the metal interconnection 20-0 is electrically connected to the power supply voltage Vdd by setting a voltage of the switching signal CSL0, which the column decoder 60 outputs to the connection switch 40-0, at Low. By achieving the connection of the metal interconnections 20-0, 20-1 through the connection switches 40-0, 40-1 as described above, it is possible to choose whether to set the power supply nodes of the memory cells at the power supply voltage or the low voltage through the charge sharing, respectively, for each of the data write operation and the data read operation. Furthermore, the controlling of the multiple connection switches 40-0, 40-1 by the column decoder 60 enables the single variable capacitance circuit 30 to be shared between the multiple sub-arrays S1, S2.

Detailed descriptions for the configuration, function and operation of the variable capacitance circuit 30 will be omitted, because the configuration, function and operation of the variable capacitance circuit 30 are identical to those of the variable capacitance circuit 30 shown in FIG. 1. The variable capacitance circuit 30 shares the charges with memory cells, among multiple memory cells M0-0 to M15-0 and M0-1 to M15-1, which are performing their write operations as a result of being selected by the word lines WL0 to WL15 and the bit lines BL0, /BL0, BL1, /BL1, as well as whose power supply nodes are connected to either of the metal interconnections 20-0, 20-1 which are electrically connected with the connection node 31 by the connection switch 40-0, 40-1. Furthermore, after the charge sharing, the discharge controller 33 discharges the charges accumulated in each of the metal interconnections ML1, ML2, ML3 by making the current path of each of the MOS transistors TR11, TR12, TR13 conductive.

Figure 3:
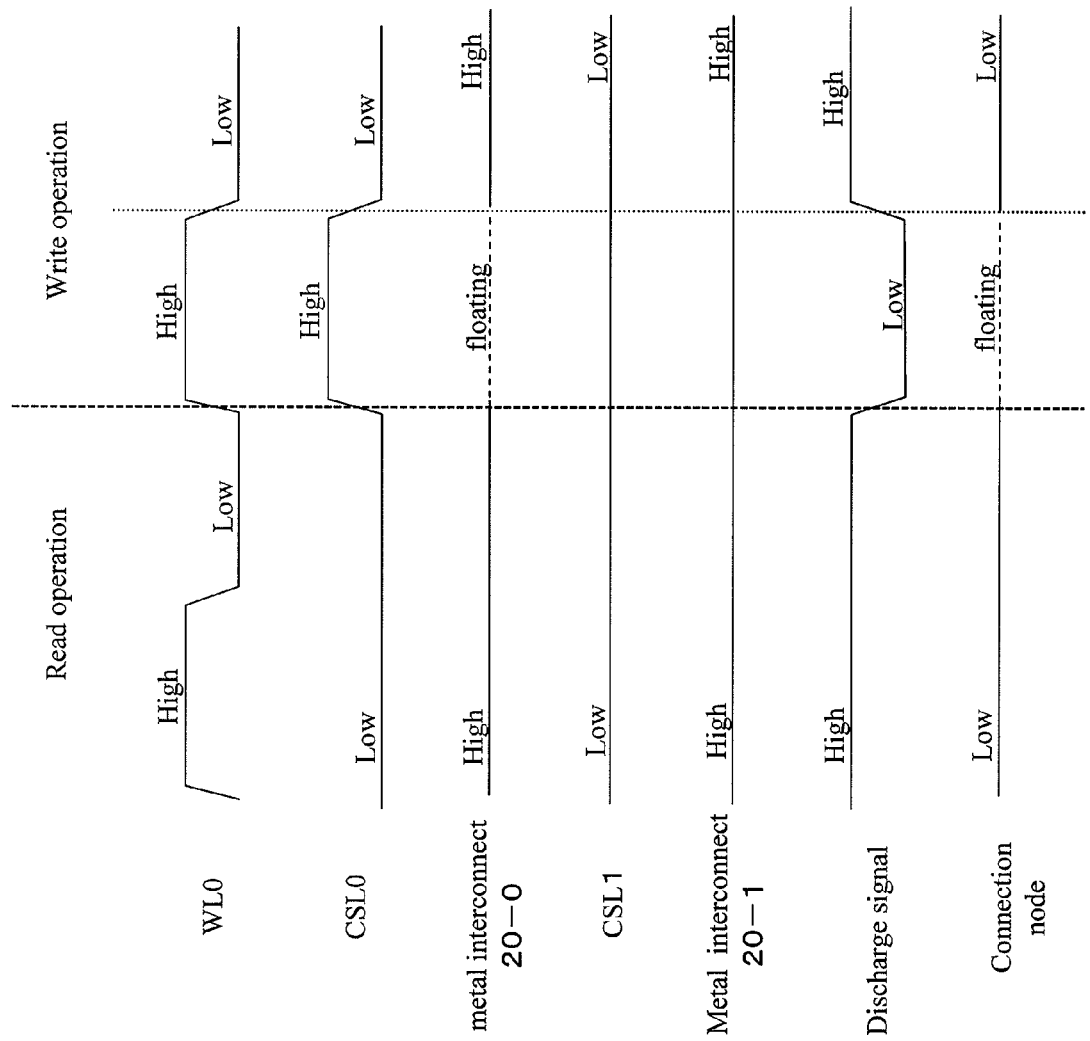
FIG. 3 is a diagram showing signals which are respectively inputted into a word line, switching signal terminals and gate terminals of MOS transistors, as well as voltages which are respectively applied to metal interconnections and a connection node, during write and read operations of the SRAM: according to Embodiment 1 of the present invention.

Next, referring to FIG. 3, descriptions will be provided for voltages which are respectively applied to the metal interconnections and the connection node while a memory cell is performing a read operation, and while the memory cell is performing a write operation. FIG. 3 is a diagram showing signals which are respectively inputted into a word line WL0, the switching signal terminals 42-0, 42-1 of the connection switches 40-0, 40-1 and gate terminals of the MOS transistors TR11, TR12, TR13, as well as voltages which are respectively applied to the metal interconnections 20-0, 20-1 and a connection node 31, during write and read operations of the SRAM according to Embodiment 1 of the present invention. Hereinbelow, descriptions will be provided for the signals which are inputted therein, and the voltages which are applied thereto, in a case where the memory cell M0-0 in the sub-array S1 is a selected cell for a read operation, and for a write operation. At this time, the sub-array S1 is a selected sub-array, whereas the sub-array S2 is a non-selected sub-array.

When a read operation to the memory cell M0-0 is requested the selected word line WL0 becomes high level for about half the period of a clock cycle. During the read operation, the switching signals CSL0, CSL1 inputted into the switching signal terminals 42-0, 42-1 of the connection switches 40-0, 40-1 to which the metal interconnections 20-0, 20-1 are connected are set Low, respectively. Thereby, the metal interconnections 20-0, 20-1 are electrically connected to the power supply voltages Vdd, and the voltages of the metal interconnections 20-0, 20-1 accordingly become High (High voltage).

During the read operation, while the signal inputted into the word line WL0 is High, data is read from the selected cell (memory cell M0-0). Once the signal inputted into the word line WL0 is turned Low, the data read from the selected cell (memory cell M0-0) is outputted to the outside. Furthermore, during the read operation, a discharge signal inputted into the gate terminals of the respective MOS transistors TR11, TR12, TR13 from the discharge controller 33 is set High. Thereby, the discharge controller 33 discharges the charges accumulated in each of the capacitances C1, C2, C3 of the respective metal interconnections ML1, ML2, ML3, and sets the voltage of the connection node 31 Low (shifts the voltage thereof to the low voltage).

When a write operation to the memory cell M0-0 is requested the selected word line WL0 becomes high level for about half the period of a clock cycle. When the High signal is inputted into the word line WL0, data is written to the selected cell (memory cell M0-0).

During the write operation, while the signal inputted into the word line WL0 is High, the signal CSL0 inputted into the switching signal terminal 42-0 of the connection switch 40-0 connected to the metal interconnection 20-0 connected to the selected memory (memory cell M0-0) is set High, whereas the signal CSL1 inputted into the switching signal terminal 42-1 of the connection switch 40-1 connected to the metal interconnection 20-1 connected to the non-selected sub-array is set Low. Thereby, the metal interconnection 20-0 is electrically connected to the connection node 31 of the variable capacitance circuit 30, whereas the metal interconnection 20-1 is electrically connected to the power supply voltage Vdd so that the voltage of the metal interconnection 20-1 becomes High (High voltage). Thereby, the charges are shared between the metal interconnection 20-0 and the variable capacitance circuit 30 (including the metal interconnections ML1, ML2, ML3), and the voltage of the metal interconnection 20-0 is accordingly put into a floating condition. Because the voltage of the variable capacitance circuit 30 (the voltage of the connection node 31, or the voltage of each of the metal interconnections ML1, ML2, ML3) is set Low (Low voltage) by the discharge signal for the write operation, the voltage of the metal interconnection 20-0 shifts to the low voltage through the sharing of the charges between the interconnection 20-0 and the variable capacitance circuit 30. Furthermore, at this time, the discharge signal inputted into each gate terminal of the MOS transistors TR11, TR12, TR13 from the discharge controller 33 is set Low.

During the write operation, while the signal inputted into the word line WL0 is Low, once the signals CSL0, CSL1 inputted to the respective switching signal terminals 42-0, 42-1 are set Low, the metal interconnections 20-0, 20-1 are connected to the power supply voltage Vdd, and the voltages of the respective metal interconnections 20-0, 20-1 accordingly become High (High voltage). At this time, the discharge signal inputted into each gate terminal of the MOS transistor TR11, TR12, TR13 from the discharge controller 33 is set High, and the charges accumulated in each of the capacitances C1, C2, C3 of the metal interconnections ML1, ML2, ML3 are accordingly discharged, respectively, so that the voltage of the connection node 31 is set Low (Low voltage).

In the case of the static random access memory according to Embodiment 1 of the present invention, as described above, for the write operation of a memory cell, a metal interconnection connected to the power supply node of the memory cell is connected to the connection node of the variable capacitance circuit 30 through the corresponding connection switch. Thereby, the charges are shared between the metal interconnection and the variable capacitance circuit 30. Thereby, the voltage of the power supply node of the memory cell shifts to the low voltage during the write operation of the memory cell, and the stability of the write operation is accordingly enhanced. In this respect, the capacitance C of the variable capacitance circuit 30 is configured to be adjustable by the corresponding capacitance controller 32. In the case of the static random access memory according to the prior art, because the number of metal interconnections which the variable capacitance circuit uses to share the charges with the corresponding metal interconnection is only one, such a configuration causes a problem that the write operation varies among the memory cells due to variation in the capacitance among the metal interconnections. However, the static random access memory according to this embodiment can ease the problem with the static random access memory according to the prior art, because: the variable capacitance circuit 30 includes the multiple metal interconnections to share the charges with the corresponding metal interconnection; and the capacitor C (composite capacitor) of the multiple metal interconnections is adjusted in the variable capacitance circuit 30.

Furthermore, in the case of the static random access memory according to this embodiment, the discharge controller is included in the variable capacitance circuit 30, and the charges accumulated in each of the capacitances C1, C2, C3 of the respective metal interconnections ML1, ML2, ML3 can be discharged by causing the discharge controller to make the current path of each of the MOS transistors TR1, TR2, TR3 conductive, respectively. Thereby, the static random access memory according to this embodiment is capable of decreasing the voltage of the power supply node in the memory cell further.

Moreover, the static random access memory according to this embodiment is allowed considerable latitude in determining the capacitance C of the variable capacitance circuit 30 by making the capacitances C1, C2, C3 of the respective metal interconnections ML1, ML2, ML3 different from one another in the variable capacitance circuit 30.

Additionally, because the PMOS transistor is used for each of the MOS transistors TR1, TR2 in the variable capacitance circuit 30, the variable capacitance circuit 30 can share the charges with the corresponding the metal interconnection efficiently compared with a variable capacitance circuit in which an NMOS transistor is instead used for each of the MOS transistors TR1, TR2. In a case where an NMOS transistor is used for each of the MOS transistors TR1, TR2, once the voltage of the connection node 31 becomes High, it is likely that: the current paths of the MOS transistors TR1, TR2 become non-conductive; and accordingly, the charges cannot be sufficiently shared between the metal interconnection 20 and the variable capacitance circuit 30. That is because, once a voltage applied to a source terminal or a drain terminal of the NMOS transistor (threshold value Vth) becomes larger than a difference between the power supply voltage and the threshold voltage (Vdd-Vth), the current path of the NMOS transistor becomes non-conductive. In contrast, in the case where the pMOS transistor is used for each of the MOS transistors TR1, TR2, the above-mentioned problem does not occur, and the charges can be accordingly shared between the metal interconnection 20 and the variable capacitance circuit 30 efficiently. In addition, because the NMOS transistor is used for each of the MOS transistors TR11, TR12, TR13 in the variable capacitance circuit 30, the variable capacitance circuit 30 is capable of discharging the charges accumulated in each of the capacitances C1, C2, C3 of the respective metal interconnections ML1, ML2, ML3 efficiently compared with a variable capacitance circuit in which a PMOS transistor is instead used for each of the MOS transistors TR1, TR2, TR3. In a case where a PMOS transistor is used for each of the MOS transistors TR11, TR12, TR13, once the electric potentials of the respective metal interconnections ML1, ML2, ML3 become lower than a threshold value Vth of the PMOS transistor, it is likely that: the current path of each pMOS transistor becomes non-conductive; and accordingly, the electric charges cannot be discharged fully. In contrast, in the case where the NMOS transistor is used for each of the MOS transistors TR11, TR12, TR13, the above-mentioned problem does not occur, and the charges can be accordingly shared between the metal interconnection 20 and the variable capacitance circuit 30 fully.

Note that, although the three metal interconnections ML1, ML2, ML3 are used in the variable capacitance circuit according to this embodiment, the number of metal interconnections used in the variable capacitance circuit may be at least two. If the number of metal interconnections is increased, the variable capacitance circuit should be configured so that each additional metal interconnection is paired with each additional MOS transistor, as in the case of the MOS transistor TR1 being interposed between the metal interconnection ML1 and the metal interconnection ML2.

[Embodiment 2]

Figure 4:
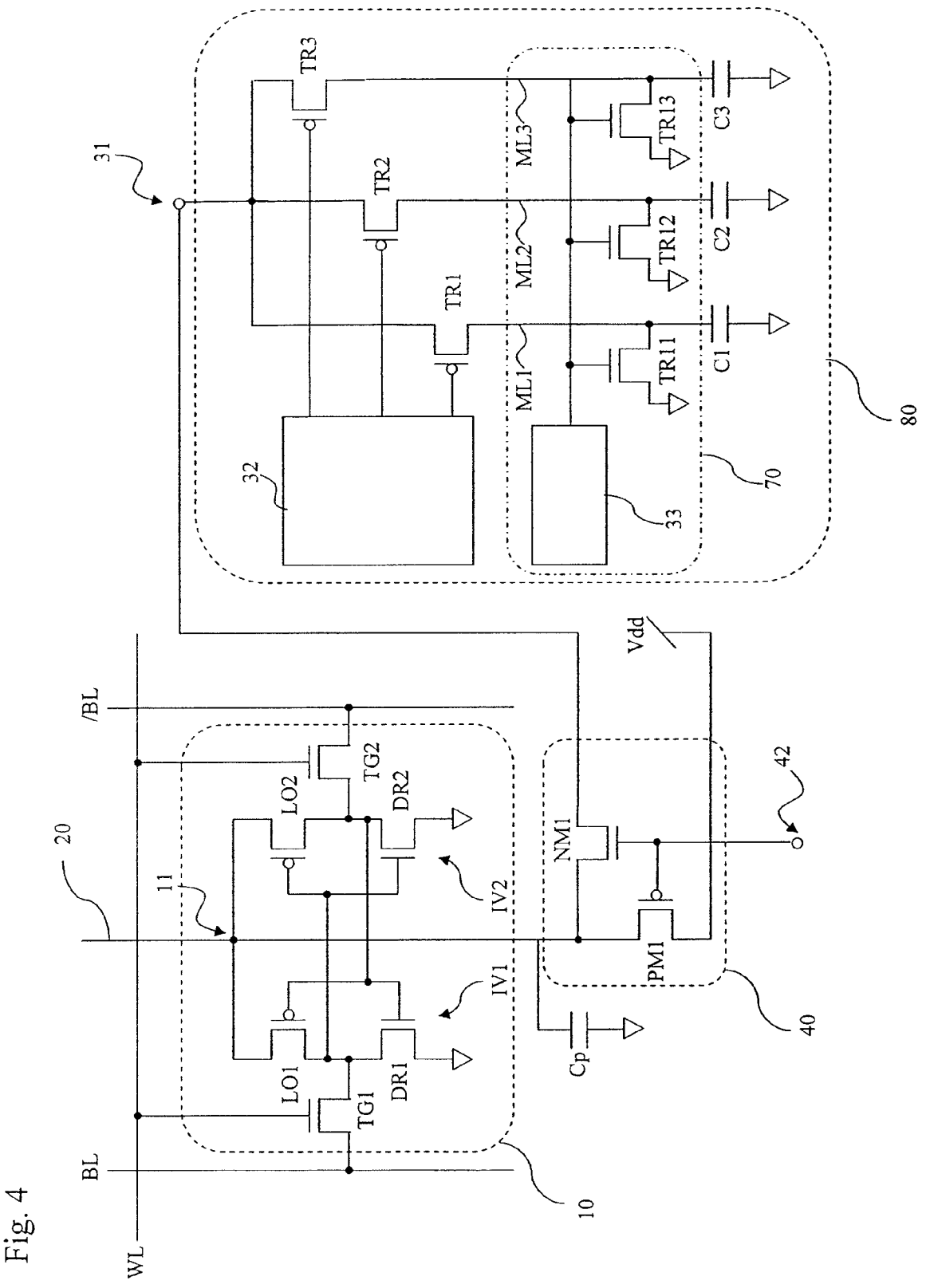
FIG. 4 is a circuit diagram showing configurations, respectively, of a memory cell, a variable capacitance circuit and a connection switch in an SRAM according to Embodiment 2 of the present invention.

FIG. 4 is a circuit diagram showing a configuration of a memory cell, a variable capacitance circuit and a connection switch in an SRAM according to Embodiment 2 of the present invention.

As shown in FIG. 4, the SRAM according to this embodiment includes a memory cell 10, a metal interconnection 20, a variable capacitance circuit 80 and a connection switch 40. Components which are the same as those of Embodiment 1 will be denoted by the same reference numerals, and descriptions for such components will be omitted.

The variable capacitance circuit 80 makes the SRAM according to this embodiment different from the SRAM according to Embodiment 1. The configuration (including the bit lines, word lines, row decoder and column decoder) of the SRAM according to this embodiment is the same as that of the SRAM according to Embodiment 1 shown in FIG. 2. For this reason, a drawing and descriptions for the configuration of the SRAM according to this embodiment will be omitted.

The variable capacitance circuit 80 of the SRAM according to Embodiment 2 includes a MOS transistor TR1, a metal interconnection ML1, a MOS transistor TR2, a metal interconnection ML2, a MOS transistor TR3, a metal interconnection ML3, a capacitance controller 32 and a discharger 70. One terminal (source terminal or drain terminal) of a current path of the MOS transistor TR1 is connected to a connection node 31. The metal interconnection ML1 is connected to the other terminal (source terminal or drain terminal) of the current path of the MOS transistor TR1. The metal interconnection ML1 has a capacitance C1. One terminal (source terminal or drain terminal) of a current path of the MOS transistor TR2 is connected to the connection node 31. The metal interconnection ML2 is connected to the other terminal (source terminal or drain terminal) of the current path of the MOS transistor TR2. The metal interconnection ML2 has a capacitance C2. One terminal (source terminal or drain terminal) of a current path of the MOS transistor TR3 is connected to the connection node 31. The metal interconnection ML3 is connected to the other terminal (source terminal or drain terminal) of the current path of the MOS transistor TR3. The metal interconnection ML3 has a capacitance C3. Gate terminals of the respective MOS transistors TR1, TR2, TR3 are connected to the capacitance controller 32. The capacitance controller 32 is configured to determine conduction conditions of the current paths of the MOS transistors TR1, TR2, TR3, respectively. The discharger 70 is configured to discharge charges accumulated in each of the capacitances C1, C2, C3 of the respective metal interconnections ML1, ML2, ML3. Note that the configuration of the discharger 70 is not limited to that shown in FIG. 4. Like the configuration of the discharger 70 according to Embodiment 1, the configuration of the discharger 70 may be whatever enables the discharger 70 to discharge charges accumulated in each of the capacitances C1, C2, C3.

The variable capacitance circuit 80 is capable of adjusting an electric capacitance of the variable capacitance circuit 30 through the determination, made by the capacitance controller 32, of the conduction conditions of the MOS transistors TR1, TR2, TR3, respectively. For example, in a case where the MOS transistor TR1 is conductive, the MOS transistor TR2 is conductive and the MOS transistor TR3 is non-conductive, the electric capacitance C of the variable capacitance circuit 80 is found using an equation $1/C=1/C1+1/C2$. In a case where the MOS transistor TR1 is conductive, the MOS transistor TR2 is non-conductive and the MOS transistor TR3 is conductive, the electric capacitance C of the variable capacitance circuit 80 is found using an equation $1/C=1/C1+1/C3$. Voltages to be applied to the respective MOS transistors TR1, TR2, TR3 are determined during the manufacturing process. The voltages are set up in the capacitance controller 32.

In the case of the variable capacitance circuit 80 according to this embodiment, for a write operation of the memory cell 10, the capacitance controller 32 makes the variable capacitance circuit 80 share the charges with the metal interconnection 20 connected to the power supply node of the memory cell 10 as in the case of the variable capacitance circuit 30 according to Embodiment 1. Thereby, during the write operation of the memory cell 10, the voltage of the power supply node of the memory cell can be shifted to the low voltage. Thereby, the voltage of the power supply node of the memory cell becomes low during the write operation of the memory cell, and the stability of the write operation is accordingly enhanced. In this respect, the capacitance C of the variable capacitance circuit 30 is configured to be capable of being adjusted by the corresponding capacitance controller 32. In the case of the static random access memory according to the prior art, because the number of metal interconnections which the variable capacitance circuit uses to share the charges with the metal interconnection is only one, the same configuration causes a problem that the write operation varies among the memory cells due to variation in the capacitance among the metal interconnections. However, the static random access memory according to this embodiment can ease the problem with the static random access memory according to the prior art, because: the variable capacitance circuit includes the multiple metal interconnections to share the charges with the metal interconnection; and the capacitor C (composite capacitor) of the multiple metal interconnections is adjusted in the variable capacitance circuit.

Moreover, the capacitance C of the variable capacitance circuit 80 is of generating 7 composite capacitances (C1, C2, C3, C1·C2, C1·C3, C2·C3, C1·C2·C3) by using the capacitances C1, C2, C3 of the respective metal interconnections ML1, ML2, ML3 solely or in combination. In other words, in a case where n metal interconnections are used in the variable capacitance circuit 80, the number of capacitances which the capacitance C of the variable capacitance circuit 80 is capable of generating is $$\sum_{k}^{n} {}_{n}C_{K}.$$

Thereby, when the capacitances C1, C2, C3 of the respective metal interconnections ML1, ML2, ML3 are made different from one another, it is possible to create a capacitance C which is allowed considerable latitude in generating capacitances.

Note that the present invention is not limited to the above-described embodiments. It goes without saying that the present invention can be carried out by variously modifying the present invention within a scope not departing from the gist of the present invention.

Furthermore, although FIGS. 1, 2 and 4 illustrate each of the capacitances Cp, C1, C2, C3 as being concentrated in a particular location in the corresponding metal interconnection, each actual capacitance is distributed in the corresponding metal interconnection.

Moreover, although FIGS. 1, 2 and 4 illustrate each of the MOS transistors TR1, TR2 as the PMOS transistor, the MOS transistor TR1, TR2 may be an NMOS transistor instead.

Similarly, although FIGS. 1, 2 and 4 illustrate each of the MOS transistors TR11, TR12, TR13 as the NMOS transistor, the MOS transistors TR11, TR12, TR13 may be a PMOS transistor instead.

What is claimed is:

1. A static random access memory comprising:
   an SRAM memory cell comprising first and second inverters cross-coupled to each other and connected to a power supply node,
   a first metal interconnection connected to the power supply node;
   a variable capacitance circuit comprising second and third metal interconnections electrically connected to a connection node, and a controller configured to control an electrical connection between the third metal interconnection and the connection node; and
   a connection switch connected between the first metal interconnection and the connection node of the variable capacitance circuit, the connection switch configured to electrically connect the first metal interconnection and the connection node in a write operation of the SRAM memory cell.

2. The static random access memory of claim 1, further comprising a discharger configured to discharge charges accumulated in the second and third metal interconnections.

3. The static random access memory of claim 1, wherein an electric capacitance of the second metal interconnection and an electric capacitance of the third metal interconnection are different from each other.

4. A static random access memory comprising:
   a memory cell comprising
      a first CMOS inverter connected between a power supply node and a ground node and comprising a first pMOS transistor and a first nMOS transistor,
      a second CMOS inverter connected between the power supply node and the ground node, comprising a second pMOS transistor and a second nMOS transistor, and comprising an input terminal connected to an output terminal of the first CMOS inverter and an output terminal connected to an input terminal of the first CMOS inverter,
      a first transfer gate transistor comprising a gate terminal connected to a word line, and a first current path, a first terminal connected to a first bit line, and a second terminal connected to the output terminal of the first CMOS inverter and the input terminal of the second CMOS inverter, and
      a second transfer gate transistor comprising a gate terminal connected to the word line, and a second current path a first terminal connected to a second bit line, and a second terminal connected to the output terminal of the second CMOS inverter and the input terminal of the first CMOS inverter;
   a first metal interconnection connected to the power supply node;
   a variable capacitance circuit comprising
      a second metal interconnection connected to a connection node and having a capacitance,
      a first MOS transistor comprising a third current path, a first terminal connected to the connection node,
      a third metal interconnection connected to a second terminal of the third current path of the first MOS transistor, and having a capacitance,
      a controller connected to a gate terminal of the first MOS transistor, and configured to determine a conduction condition of the third current path of the first MOS transistor, and
      a discharger configured to discharge charges accumulated in the capacitances in the second metal interconnection and in the third metal interconnection; and
   a connection switch connected between the first metal interconnection and the connection node of the variable capacitance circuit, and configured to electrically connect the first metal interconnection and the connection node in a write operation of the memory cell.

5. The static random access memory of claim 4, wherein the discharger comprises:
   a third MOS transistor comprising a fifth current path, a first terminal connected to the second metal interconnection, and a second terminal connected to a ground potential;
   a fourth MOS transistor comprising a sixth current path, a first terminal connected to the third metal interconnection, and a second terminal connected to the ground potential; and a discharge controller connected to a gate terminal of the third MOS transistor and a gate terminal of the fourth MOS transistor, and configured to control a conduction condition of the fifth current path of the third MOS transistor and a conduction condition of the sixth current path of the fourth MOS transistor.

6. The static random access memory of claim 4, wherein an electric capacitance of the second metal interconnection and an electric capacitance of the third metal interconnection are different from each other.

7. The static random access memory of claim 4, wherein the first MOS transistor is an nMOS transistor.

8. A static random access memory comprising:
a memory cell comprising
  a first CMOS inverter connected between a power supply node and a ground node and comprising a first pMOS transistor and a first nMOS transistor,
  a second CMOS inverter connected between the power supply node and the ground node, comprising a second pMOS transistor and a second nMOS transistor, and comprising an input terminal connected to an output terminal of the first CMOS inverter, and an output terminal connected to an input terminal of the first CMOS inverter,
  a first transfer gate transistor comprising a gate terminal connected to a word line, and a first current path, a first terminal connected to a first bit line, and a second terminal connected to the output terminal of the first CMOS inverter and the input terminal of the second CMOS inverter, and
  a second transfer gate transistor comprising a gate terminal connected to the word line, and a second current path, a first terminal connected to a second bit line, and a second terminal connected to the output terminal of the second CMOS transistor and the input terminal of the first CMOS transistor;
a first metal interconnection connected to the power supply node; and
a variable capacitance circuit comprising
  a first MOS transistor comprising a third current path, a first terminal connected to a connection node,
  a second MOS transistor comprising a fourth current path, a first terminal connected to the connection node,
  a second metal interconnection connected to a second terminal of the third current path of the first MOS transistor, and having a capacitance,
  a third metal interconnection connected to a second terminal of the fourth current path of the second MOS transistor, and having a capacitance,
  a controller connected to a gate terminal of the first MOS transistor and a gate terminal of the second MOS transistor, and configured to determine a conduction condition of the third current path of the first MOS transistor and a conduction condition of the fourth current path of the second MOS transistor, and
  a discharger configured to discharge charges accumulated in the capacitance in the second metal interconnection and the third metal interconnection; and
a connection switch connected between the first metal interconnection and the connection node of the variable capacitance circuit, and configured to connect the first metal interconnection and the connection node in a write operation of the memory cell.

9. The static random access memory of claim 8, wherein the discharger comprises:
  a third MOS transistor comprising a fifth current path, a first terminal connected to the second metal interconnection, and a second terminal connected to a ground potential;
  a fourth MOS transistor comprising a sixth current path, a first terminal connected to the third metal interconnection, and a second terminal connected to the ground potential; and
  a discharge controller connected to a gate terminal of the third MOS transistor and a gate terminal of the fourth MOS transistor, and configured to control a conduction condition of the fifth current path of the third MOS transistor and a conduction condition of the sixth current path of the fourth MOS transistor.

10. The static random access memory of claim 8, wherein an electric capacitance of the second metal interconnection and an electric capacitance of the third metal interconnection are different from each other.

11. The static random access memory of claim 8, wherein each of the first MOS transistor and the second MOS transistor is an nMOS transistor.

* * * * *